United States Patent
Ortiz-Aguilar et al.

(10) Patent No.: US 11,101,729 B1
(45) Date of Patent: Aug. 24, 2021

(54) PROTECTION CIRCUIT FOR HIGH INDUCTIVE LOADS

(71) Applicant: Vitesco Technologies USA, LLC, Auburn Hills, MI (US)

(72) Inventors: Jose de Jesus Ortiz-Aguilar, Rochester Hills, MI (US); Mario Alejandro Rodriguez Rodriguez, Rochester, MI (US); Jorge Gonzalez-Amaya, Lake Orion, MI (US)

(73) Assignee: Vitesco Technologies USA, LLC, Auburn Hills, MI (US)

( * ) Notice: Subject to any disclaimer, the term of this patent is extended or adjusted under 35 U.S.C. 154(b) by 0 days.

(21) Appl. No.: 16/832,211

(22) Filed: Mar. 27, 2020

(51) Int. Cl.
*H02M 1/38* (2007.01)
*H02H 3/087* (2006.01)
*H03K 17/0814* (2006.01)

(52) U.S. Cl.
CPC .............. *H02M 1/38* (2013.01); *H02H 3/087* (2013.01); *H03K 17/0814* (2013.01)

(58) Field of Classification Search
CPC ...... H02M 1/38; H02H 3/087; H03K 17/0814
USPC .......................................................... 361/57
See application file for complete search history.

(56) References Cited

U.S. PATENT DOCUMENTS

| | | | |
|---|---|---|---|
| 6,317,458 B1 * | 11/2001 | Boggs | H02M 3/156 323/276 |
| 7,133,268 B2 * | 11/2006 | Teggatz | B60T 8/36 361/91.1 |
| 7,746,042 B2 | 6/2010 | Williams et al. | |
| 7,977,926 B2 | 7/2011 | Williams | |
| 8,035,364 B2 | 10/2011 | Williams | |
| 8,487,592 B2 | 7/2013 | Koeppl et al. | |
| 8,908,393 B2 | 12/2014 | Ye et al. | |
| 9,413,238 B2 * | 8/2016 | Kanzaki | H02M 3/158 |
| 2008/0030917 A1 | 2/2008 | Takahashi et al. | |
| 2008/0197904 A1 * | 8/2008 | Bolz | H03K 17/6871 327/180 |
| 2010/0171473 A1 | 7/2010 | Kazama | |
| 2015/0116007 A1 | 4/2015 | Garcia de Alba Garcin et al. | |
| 2015/0303806 A1 * | 10/2015 | Madsen | H02M 1/08 323/271 |
| 2019/0123541 A1 | 4/2019 | Takuma et al. | |
| 2020/0036380 A1 * | 1/2020 | Matsubara | H03K 17/284 |

\* cited by examiner

*Primary Examiner* — Yemane Mehari

(57) ABSTRACT

A drive circuit is disclosed. The drive circuit includes a high-side switch coupled between a power supply and an inductive load, and a low-side switch coupled between the load and ground. A current sense device is connected in series with the high-side switch, the low-side switch and the load. A control circuit controls the high-side and low-side switches. The control circuit further includes an input coupled to an output of the current sense device, and is configured to selectively provide a current path between the first and second terminals of the inductive load based upon the output of the current sense device. The current path is provided when an overcurrent condition exists, and dissipates energy stored in the inductive load in response to the overcurrent condition.

19 Claims, 5 Drawing Sheets

PROTECTION CIRCUIT FOR HIGH INDUCTIVE LOADS

FIELD OF INVENTION

The present invention generally relates to protection circuitry, and particularly to a protection circuit for handling high energy in an inductive load during overcurrent conditions.

BACKGROUND

FIG. 1 illustrates a conventional drive circuit 10 for an inductive load L. As shown, drive circuit 10 includes a high-side switch 12 connected between a power supply VDC and a first terminal of a load L; and a low-side switch 14 connected between a second terminal of load L and a ground reference. A current sense device 16, such as a resistor, is series-connected with high-side switch 12, load L and low-side switch 14. A diode 18 is connected between the node between high-side switch 12 and load L, and the ground reference. In one arrangement of a pulse-width modulated (PMW) mode, a PWM control signal is applied to a control (gate) terminal of high-side switch 12 and an enable control signal is applied to the control (gate) terminal of low-side switch 14.

FIG. 2 illustrates current of load L as a function of time during a normal operation. Here, low-side switch 14 is turned on while high-side switch 12 is turned on and off based upon the PWM control signal applied to its control terminal. As shown, the load current increases from zero in a rise-to-peak phase, then is held within a range of current levels in a hold phase, before falling to zero in an end-of-activation phase. When high-side switch 12 and low-side switch 14 are turned off, the energy in load L is usually dissipated by a clamping element 19 which is connected in parallel with low-side switch 14. Clamping element 19 may be a diode, such as a transient-voltage-suppression (TVS) diode, and implemented as a separate component(s) or is integrally formed with low-side switch 14 (i.e., as the body diode of low-side switch 14). A clamping voltage of clamping element 19 is typically greater than the voltage of the power supply VDC.

During normal operation of load L a fault condition may occur, such as a short-circuit-to-voltage supply condition in which, for example, the terminal of load L that is connected to high-side switch 12 is shorted to the power supply VDC. When high-side switch 12 and low-side switch 14 are turned off in response to an overcurrent detection using the output of current sense device 16, a large amount of energy may be stored in load L. With switches 12 and 14 turned off, load L will discharge energy through clamping element 19. For a high inductance load L, a large amount of energy would be stored in load L. The clamping voltage for clamping element 19 may be considerably higher than the voltage of power supply VDC, e.g., 50 V clamping voltage versus 10 V power supply voltage VDC, in order to assure a fast turn off time of switches 12 and 14. Clamping element 19 is typically configured to withstand repetitive energy determined by load L and the expected higher regulated current before the circuit turns off or a lower amount of energy and high current corresponding to a hard short circuit between low-side switch 14 and load L (i.e., no load) and is not configured to withstand a single event of high energy levels stored in load L when the terminal of load L to which high-side switch 12 is connected is shorted to power supply VDC. As a result, low-side switch 14 and/or clamping element 19 may be damaged during dissipation of the energy stored in load L.

SUMMARY

Example embodiments of the present disclosure overcome shortcomings in existing protection circuits and satisfy a need for a circuit that provides enhanced protections due to short circuit and/or overcurrent conditions. In accordance with an example embodiment, there is disclosed a drive circuit for an inductive load, including a high-side switch having a first conductive terminal coupled to a power supply, a second conductive terminal coupled to a first terminal of an inductive load, and a control terminal; and a low-side switch having a first conductive terminal coupled to a second terminal of the inductive load, a second conductive terminal coupled to a ground reference, and a control terminal. A current sense device is connected in series with the high-side switch, the low-side switch and the inductive load. A clamping component is connected in parallel with the low-side switch. The clamping component clamps a voltage across the clamping component to be no more than a clamping voltage that is greater than a voltage corresponding to the power supply. A control circuit having a first output coupled to the control terminal of the high-side switch and a second output coupled to the control terminal of the low-side switch, selectively turns on and off the high-side and low-side switches. The control circuit further includes an input coupled to an output of the current sense device, the control circuit configured to selectively provide a current path between the first and second terminals of the inductive load based upon the output of the current sense device. The current path dissipates energy in the inductive load.

The control circuit detects a short-circuit condition at at least the first terminal of the inductive load, based upon the output of the current sense device, and provides the current path in response to the detection.

The drive circuit further includes a diode, the diode being part of the current path and connected across the first and second terminals of the load based upon the output of the current sense device.

The drive circuit further includes a third switch series-connected with the diode across the first and second terminals of the load, and the control circuit includes a timer circuit having an output coupled to a control terminal of the third switch. The timer circuit activates the third switch for a first period of time.

The control circuit detects an overcurrent condition through the load based upon the output of the current sense device, and activates the timer circuit following detection of the overcurrent condition.

The timer circuit includes counter circuitry and a latch circuit having an input coupled to an output of the counter circuitry and an output connected to the control terminal of the third switch.

The control circuit includes a processor or controller and the timer circuit is part of the processor or controller.

The high-side switch and the low-side switch are turned off by the control circuit when the control circuit provides the current path between the first and second terminals of the inductive load.

A method of driving an inductive load includes connecting a high-side switch between a power supply terminal and a first terminal of an inductive load, and connecting a low-side switch between a second terminal of the inductive load and a ground reference. The method further includes selectively turning on and off the high-side switch and the low-side switch, one of the high-side switch and the low-side switch turned on and off using a pulse-width modulation control signal and the other of the high-side switch and the low-side switched turned on and off using an enable control signal. The method also includes detecting a current in the inductive load exceeding a threshold current level. Following the detection, the method includes turning off the high-side and low-side switches and configuring the inductive load in a free-wheeling state.

Turning off the high-side and low-side switches and configuring the inductive load in the free-wheeling state occur for a period of time.

Configuring the inductive load in the free-wheeling state includes providing a diode between the first and second terminals of the inductive load.

The method further includes clamping a voltage across the low-side switch to a clamping voltage that is greater than a voltage level of the power supply terminal.

Turning off the high-side and low-side switches and configuring the inductive load in the free-wheeling state occur for a predetermined period of time.

Another example embodiment is directed to a drive circuit for an inductive load, including a high-side switch having a first conductive terminal coupled to a power supply, a second conductive terminal coupled to a first terminal of an inductive load, and a control terminal; a low-side switch having a first conductive terminal coupled to a ground reference, a second conductive terminal coupled to a second terminal of the inductive load, and a control terminal; and a current sense device connected in series with the high-side switch, the low-side switch and the inductive load. A control circuit has a first output coupled to the control terminal of the high-side switch and a second output coupled to the control terminal of the low-side switch. The control circuit selectively turns on and off the high-side and low-side switches according to a predetermined inductive load drive scheme. The control circuit includes an input coupled to an output of the current sense device. The control circuit is configured to detect an overcurrent condition in the inductive load and in response to the detection, selectively configure the inductive load in a free-wheeling state to dissipate energy stored in the inductive load. The high-side switch and the low-side switch are turned off by the control circuit when the inductive load is in the free-wheeling state.

The drive circuit further includes a diode, the diode being part of a current path connected across the first and second terminals of the inductive load during the free-wheeling state.

The drive circuit further includes a third switch series-connected with the diode across the first and second terminals of the inductive load. The control circuit includes a timer circuit having an output coupled to a control terminal of the third switch, the timer circuit activating the third switch for a period of time.

In a configuration, the timer circuit includes counter circuitry and a latch circuit having an input coupled to an output of the counter circuitry, and an output connected to the control terminal of the third switch.

In another configuration, the control circuit includes a microprocessor or microcontroller, and the timer circuitry is part of the microprocessor or microcontroller.

The control circuit controls one of the high-side switch and the low-side switch with a pulsewidth modulated signal and the other of the high-side switch and the low-side switch with an enable control signal.

BRIEF DESCRIPTION OF THE DRAWINGS

Aspects of the invention will be explained in detail below with reference to exemplary embodiments in conjunction with the drawings, in which.

DETAILED DESCRIPTION

The following description of the example embodiment(s) is merely exemplary in nature and is in no way intended to limit the invention, its application, or uses. In the figures and throughout the detailed description, the same reference numbers are used to identify identical or similar elements. For the sake of clarity, the elements are not shown to scale unless otherwise specified.

The example embodiments are generally directed to placing load L in a free-wheeling state upon detecting an overcurrent condition through load L. By dissipating energy in load L in this way instead of dissipation through clamping element 19, high energy levels are not dissipated through clamping element 19 which serves to lessen the chance of damage to clamping element 19 and low-side switch 14.

Figure 3:
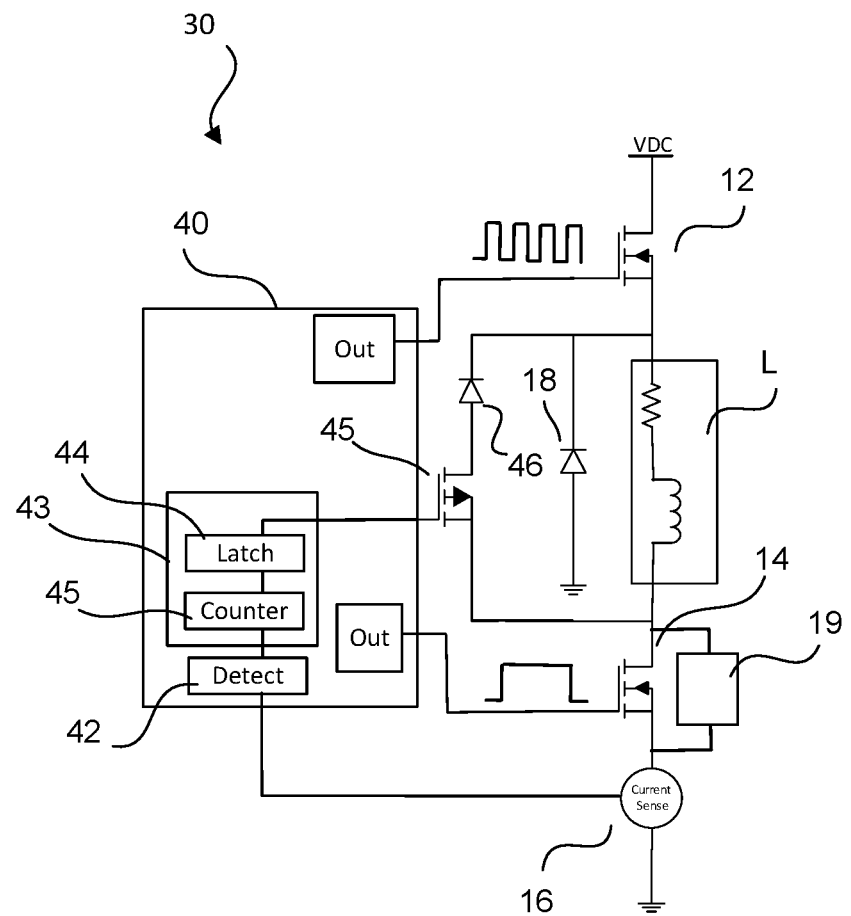
FIG. 3 is a simplified schematic diagram of a drive circuit for an inductive load according to an example embodiment.

FIG. 3 illustrates a drive circuit 30 for driving an inductive load L according to an example embodiment. As shown, drive circuit 30 includes high-side switch 12 connected between power supply VDC and load L, low-side switch 14 connected between load L and ground, current sense device 16 connected in series with high-side switch 12, low-side switch 14 and load L, and diode 18 connected between ground and the node connecting high-side switch 12 and load L. In this particular embodiment, a PWM control signal is applied to the control terminal of high-side switch 12, and an enable control signal is applied to the control terminal of low-side switch 14. It is understood, however, that a PWM control signal may be applied to low-side switch 14 and an enable control signal may be applied to high-side switch 12, in which case clamping element 19 would be connected across high-side switch 12, diode 18 would have one terminal connected to the terminal of load L to which low-side switch 14 is connected and a second terminal connected to power supply VDC, and current sense device 16 would be connected between high-side switch 12 and power supply VDC. Drive circuit 30 further includes a control circuit 40 which includes a first output connected to the control (gate) terminal of high-side switch 12, and a second output connected to the control (gate) terminal of low-side switch 12. Control circuit 40 provides the PWM control signal and the enable control signal to high-side switch 12 and low-side switch 14. Circuitry for providing control signals to high-side and low-side switches driving an inductive load is very well known in the art such a more detailed description will not be provided for the sake of expediency.

Control circuit 40 is also configured to selectively provide a current path between the first and second terminals of the inductive load when an overcurrent condition is detected in load L. Stated another way, control circuit 40 is configured to place load L in a free-wheeling state when the overcurrent condition is detected. By providing the current path upon detection of an overcurrent condition, which may be a short-circuit to power supply VDC at the terminal of load L connected to high-side switch 12, the provided current path/free-wheeling state of load L effectively dissipates energy stored in load L, thereby serving to avoid low-side switch 14 and clamping component 19 from exposure to high energy levels.

In an example embodiment illustrated in FIG. 3, drive circuit 30 includes a diode 46 which is series-connected with a switch 45, such series-connection being parallel-connected across load L. By selectively actuating and/or turning on switch 45 so that diode 46 is disposed across load L during a short-circuit and/or overcurrent event, load L is placed in a free-wheeling state in which high levels of energy stored in load L are safely dissipated.

Control circuit 40 provides a control signal to the control (gate) terminal of switch 45. In one example embodiment, control circuit 40 includes a detection circuit 42 which receives an output of current sense device 16 and detects whether the current through load L exceeds a predetermined current level corresponding to an overcurrent condition. Detection circuit 42 may include a voltage comparator which compares a voltage level corresponding to the output of current sense device 16 with a predetermined voltage. It is understood that detection circuit 42 may have other implementations.

Control circuit 40 further includes a timer circuit 43 having an input coupled to the output of interface circuit 42 and an output connected to the control (gate) terminal of switch 45. Timer circuit 43 is configured to provide a control signal for activating switch 45 so as to provide diode 46 across load L, and deactivating switch 45 following energy in load L being dissipated. The duration of control signal provided to switch 45 may be predetermined or determined based upon other factors and/or operating parameters of drive circuit 30 and load L.

In an example embodiment, timer circuit 43 may be implemented by counter circuitry 45 which, for example, counts a number of clock cycles associated with drive circuit 30. Timer circuit 43 may further include a latch circuit 44 having an input coupled to an output of counter circuitry 45. It is understood that timer circuit 43 may be implemented in other ways in providing an activation control signal to switch 45.

Control circuit 40 may be a processor, microprocessor, controller or microcontroller based implementation. In this way, timer circuitry 43 may be formed from part of the processor, microprocessor, controller or microcontroller.

Figure 4:
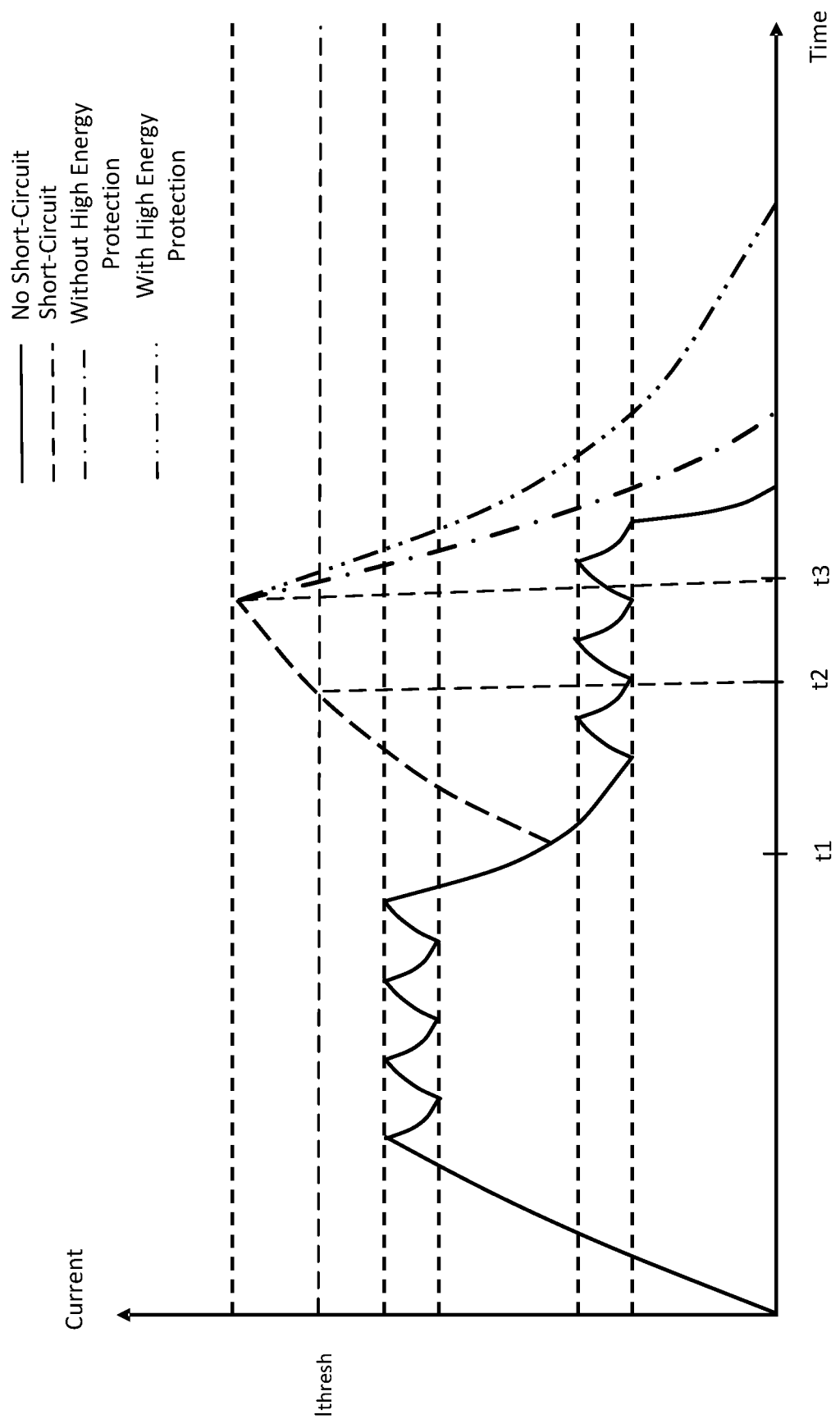
FIG. 4 is a current waveform illustrating operation of an inductive load without a short-circuit condition, with a short-circuit condition with the conventional drive circuit of FIG. 1, and with a short-circuit condition with the drive circuit of FIG. 3.

FIG. 4 illustrates the operation of driver circuit 30 and load L in accordance to an example embodiment. In FIG. 4, current through load L is shown on the Y-axis and time on the X-axis. The solid graph shows load current in which there is no short circuit condition. The graph with the dashed line shows load current when there is a short circuit event starting at time t1. Here, the load current rises beyond a predetermined threshold current $I_{thres}$. The curve having a "dot-dash" representation is the load current when a conventional approach is used to address the short circuit event starting at time t1, such as the approach discussed above with respect to the drive circuit of FIG. 1. Here, after the load current exceeds threshold current $I_{thres}$, high-side switch 12 and low-side switch 14 are turned off and energy stored in load L is dissipated through clamping device 19. However, with load L being a high inductance load and clamping device 19 having a clamping voltage that greatly exceeds the voltage of power supply VDC, a large amount of energy is dissipated through clamping device 19 which may damage clamping device 19 and/or low-side switch 14.

The curve having the "double dot-dash" representation is the load current when driver circuit 30 of FIG. 3 is utilized to address the short circuit event starting at time t1. Here, detection circuit 42 detects when current sensed by current sense device 16 exceeds threshold current $I_{thres}$ at time t2 and confirms the overcurrent event a time later at time t3 following filter and blanking time delays. At this time t3, control circuit 40 causes high-side switch 12 and low-side switch 14 to turn off, and timer circuit 43 causes switch 45 to turn on, which creates a current path across the terminals of load L through diode 46. This places load L in a free-wheeling state during which the energy stored in load L is dissipated. Timer circuit 43 maintains this current path (i.e., maintains switch 45 turned on) for a period of time which allows for the energy in load L to be fully or near fully dissipated. By dissipating energy in load L in the free-wheeling state instead of dissipating the energy through clamping device 19, the energy in load L does not damage or otherwise adversely affect clamping device 19 and low-side switch 14.

Figure 1:
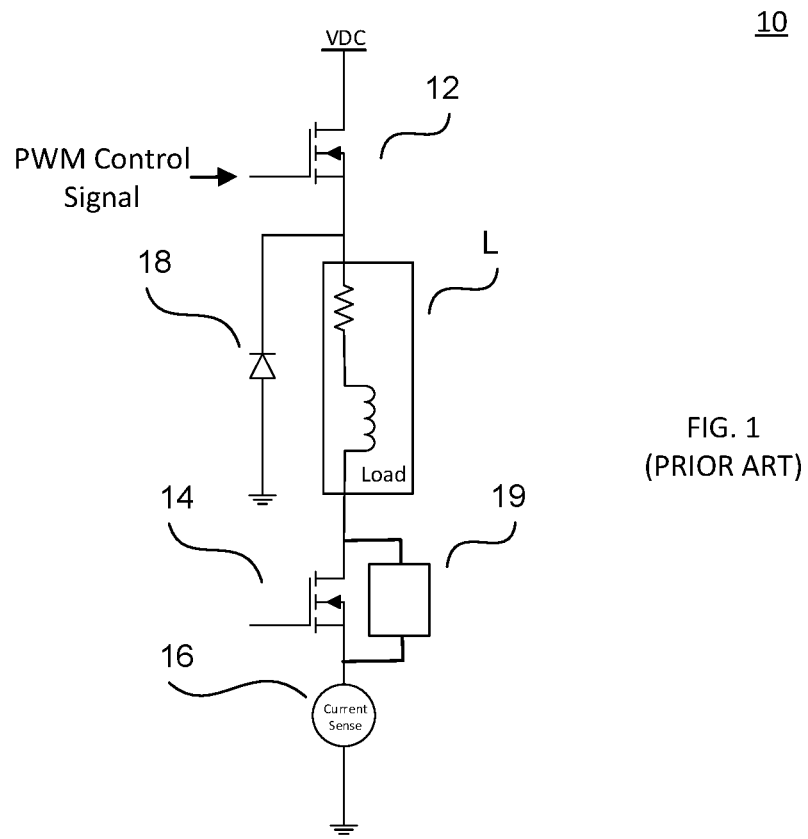
FIG. 1 is a simplified schematic diagram of a conventional drive circuit for an inductive load.
Figure 2:
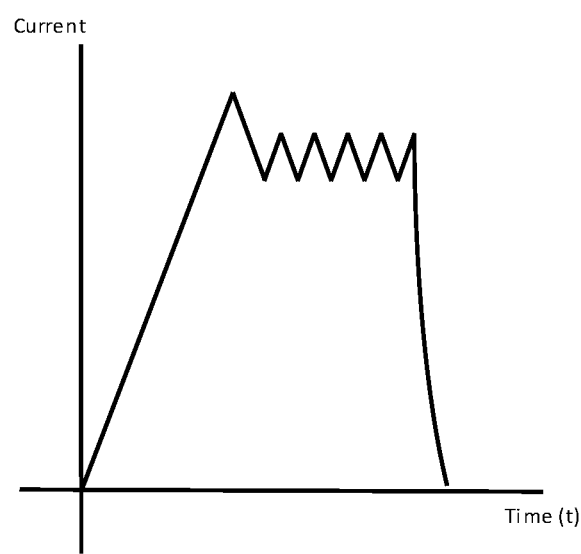
FIG. 2 is a current waveform of an inductive load during a normal operation of driving the load.
Figure 5:
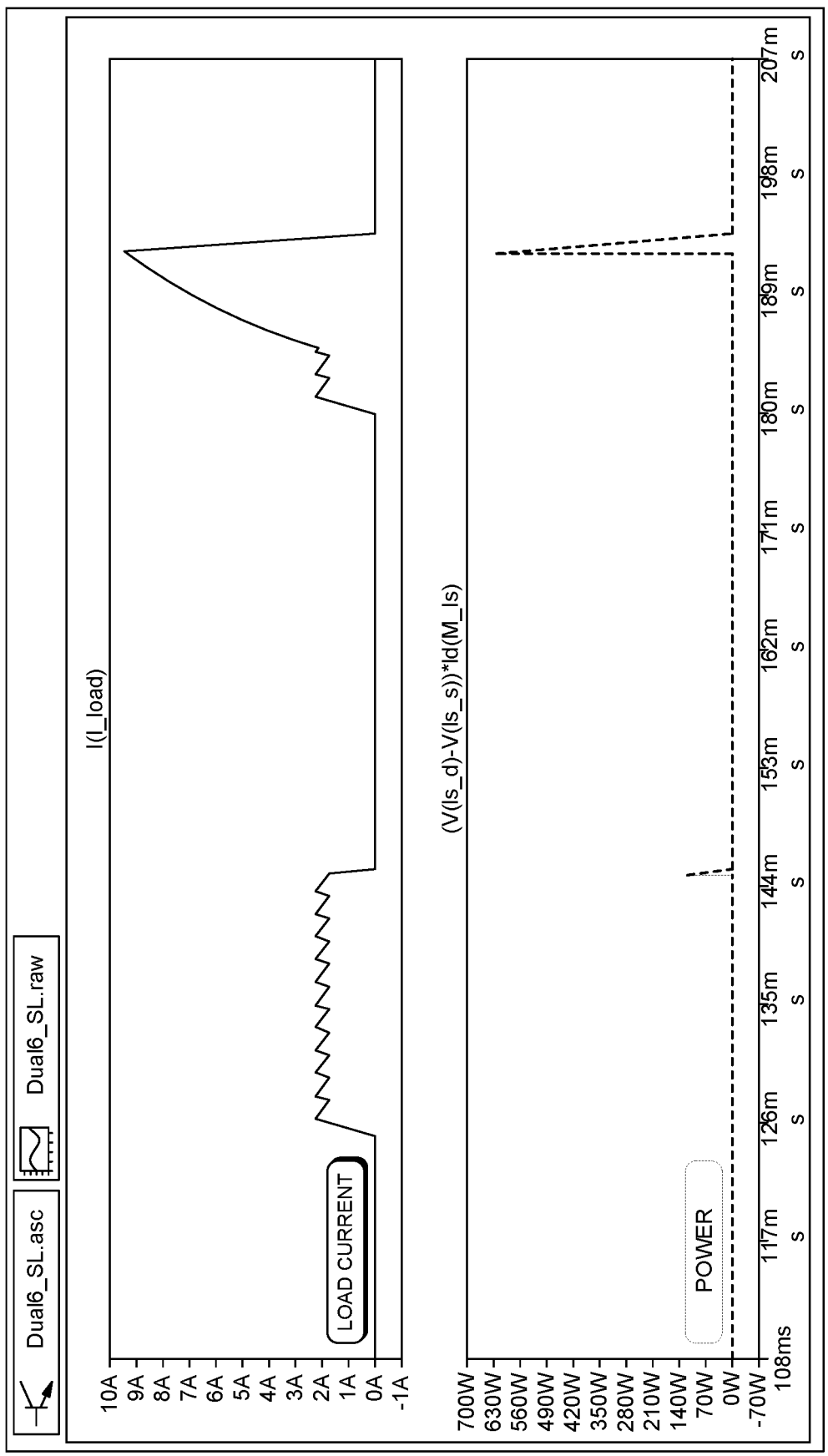
FIG. 5 is simulation waveform of current and power associated with an inductive load with the drive circuit of FIG. 1, with and without a short-circuit event.
Figure 6:
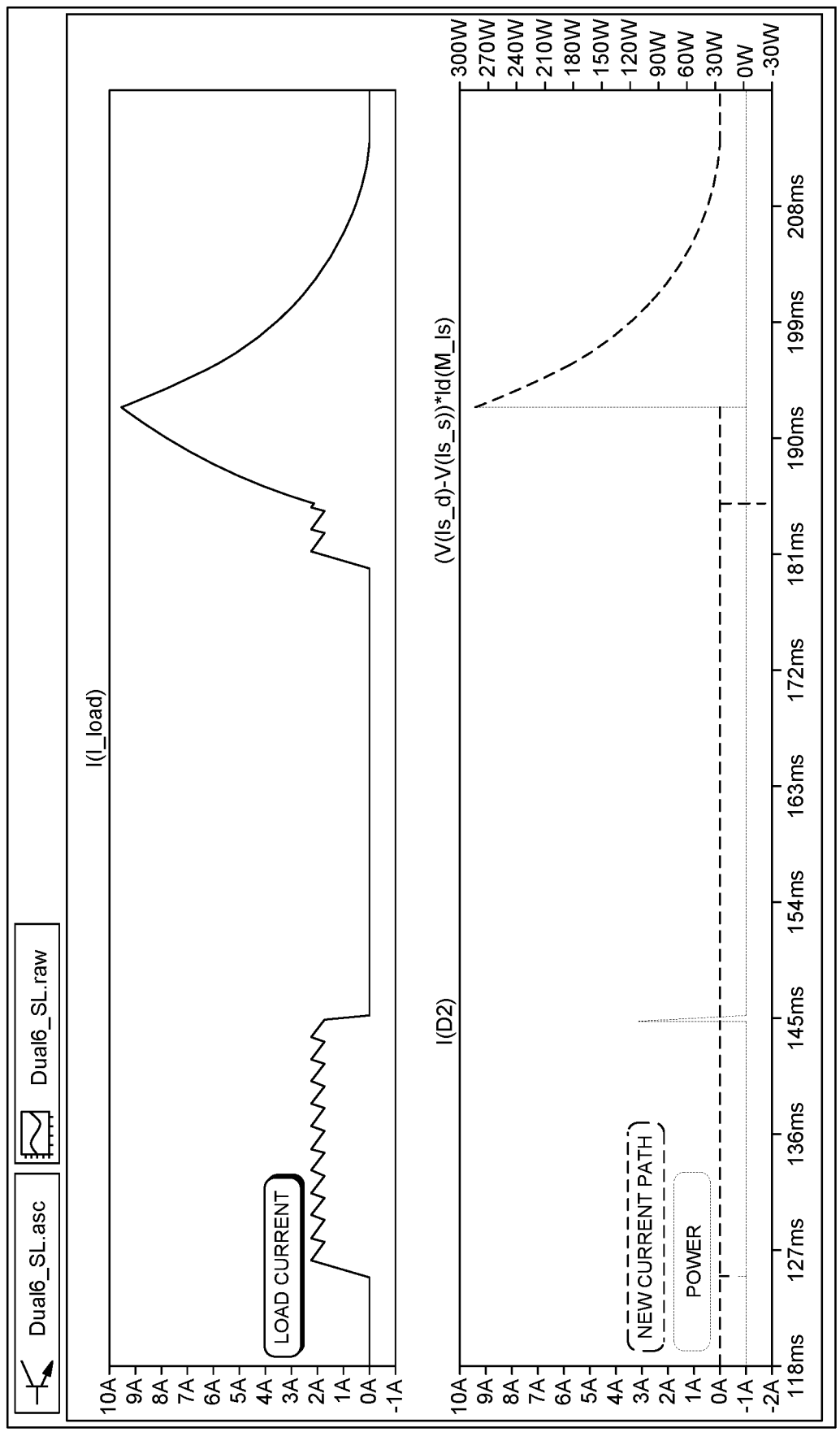
FIG. 6 is a simulation waveform of current and power associated with an inductive load with the drive circuit of FIG. 3, with and without a short-circuit event.

FIGS. 5 and 6 illustrate simulations of current and power levels associated with load L when overcurrent events are addressed by the circuits of FIGS. 1 and 3, respectively. In each drawing, load current is displayed in the upper graph and load power is displayed in the lower graph. The load current shows a normal operation followed by a short circuit event during the time current passes through load L. As can be seen, average load power increases as a result of the short circuit event relative to average load power during normal operation of load L. For FIG. 5, the average power increases from about 600 mW during normal operation to about 145 W during loading with the short-circuit event, and the energy on clamping device 19 is seen to increase from about 14 mJ to about 376 mJ. For FIG. 6, average load power due to the short circuit event also increases to about 145 mW, but the energy on clamping device 19 is only about 6 mJ due to the short circuit. As can be seen, the drop in energy stored in load L that is handled by clamping device 19 advantageously serves to avoid subjecting clamping device 19 from dissipating high amounts of energy, thereby preserving clamping device 19 and low-side switch 14.

The example embodiments have been described herein in an illustrative manner, and it is to be understood that the terminology which has been used is intended to be in the nature of words of description rather than of limitation. Obviously, many modifications and variations of the invention are possible in light of the above teachings. The description above is merely exemplary in nature and, thus, variations may be made thereto without departing from the spirit and scope of the invention as defined in the appended claims.

What is claimed is:

1. A drive circuit for an inductive load, comprising:
a high-side switch having a first conductive terminal coupled to a power supply, a second conductive terminal coupled to a first terminal of an inductive load, and a control terminal;
a low-side switch having a first conductive terminal coupled to a second terminal of the inductive load, a second conductive terminal coupled to a ground reference, and a control terminal;
a current sense device connected in series with the high-side switch, the low-side switch and the inductive load;
a clamping component connected in parallel with the low-side switch, the clamping component clamps a voltage across the clamping component to be no more than a clamping voltage that is greater than a voltage corresponding to the power supply; and
a control circuit having a first output coupled to the control terminal of the high-side switch and a second output coupled to the control terminal of the low-side switch, the control circuit selectively turning on and off the high-side and low-side switches, the control circuit further comprising an input coupled to an output of the current sense device, the control device configured to selectively provide a current path between the first and second terminals of the inductive load based upon the output of the current sense device, the current path dissipating energy in the inductive load.

2. The drive circuit of claim 1, wherein the control circuit detects a short-circuit condition at at least the first terminal of the inductive load, based upon the output of the current sense device, and provides the current path in response to the detection.

3. The drive circuit of claim 1, further comprising a diode, the diode being part of the current path and connected across the first and second terminals of the load based upon the output of the current sense device.

4. The drive circuit of claim 3, further comprising a third switch series-connected with the diode across the first and second terminals of the load, and the control circuit comprises a timer circuit having an output coupled to a control terminal of the third switch, the timer circuit activating the third switch for a first period of time.

5. The drive circuit of claim 4, wherein the control circuit detects an overcurrent condition through the load, based upon the output of the current sense device, and activates the timer circuit following detection of the overcurrent condition.

6. The drive circuit of claim 4, wherein the timer circuit comprises counter circuitry and a latch circuit having an input coupled to an output of the counter circuitry, and an output connected to the control terminal of the third switch.

7. The drive circuit of claim 4, wherein the control circuit comprises processor or controller, the timer circuit being part of the processor or controller.

8. The drive circuit of claim 1, wherein the high-side switch and the low-side switch are turned off by the control circuit when the control circuit provides the current path between the first and second terminals of the inductive load.

9. A method of driving an inductive load, comprising:
connecting a high-side switch between a power supply terminal and a first terminal of an inductive load, and connecting a low-side switch between a second terminal of the inductive load and a ground reference;
selectively turning on and off the high-side switch and the low-side switch, one of the high-side switch and the low-side switch turned on and off using a pulse-width modulation control signal and the other of the high-side switch and the low-side switched turned on and off using an enable control signal;
detecting a current in the inductive load exceeding a threshold current level;
following the detection, turning off the high-side and low-side switches and configuring the inductive load in a free-wheeling state.

10. The method of claim 9, wherein turning off the high-side and low-side switches and configuring the inductive load in the free-wheeling state occur for a period of time.

11. The method of claim 9, wherein configuring the inductive load in the free-wheeling state comprises providing a diode between the first and second terminals of the inductive load.

12. The method of claim 9, further comprising clamping a voltage across the other of the high-side switch and the low-side switch to a clamping voltage that is greater than a voltage level of the power supply terminal.

13. The method of claim 9, wherein turning off the high-side and low-side switches and configuring the inductive load in the free-wheeling state occur for a predetermined period of time.

14. A drive circuit for an inductive load, comprising:
a high-side switch having a first conductive terminal coupled to a power supply, a second conductive terminal coupled to a first terminal of an inductive load, and a control terminal;
a low-side switch having a first conductive terminal coupled to a ground reference, a second conductive terminal coupled to a second terminal of the inductive load, and a control terminal;
a current sense device connected in series with the high-side switch, the low-side switch and the inductive load;
a clamping component connected in parallel with one of the high-side switch and the low-side switch, the clamping component clamps a voltage across the clamping component to be no more than a clamping voltage that is greater than a voltage corresponding to the power supply; and
a control circuit having a first output coupled to the control terminal of the high-side switch, a second output coupled to the control terminal of the low-side switch, the control circuit selectively turning on and off the high-side and low-side switches according to a predetermined inductive load drive scheme, and an input coupled to an output of the current sense device, the control circuit configured to detect an overcurrent condition in the inductive load and in response to the detection, selectively configure the inductive load in a free-wheeling state to dissipate energy stored in the inductive load,
wherein the high-side switch and the low-side switch are turned off by the control circuit when the inductive load is in the free-wheeling state.

15. The drive circuit of claim 14, further comprising a diode, the diode being part of a current path connected across the first and second terminals of the inductive load during the free-wheeling state.

16. The drive circuit of claim 15, further comprising a third switch series-connected with the diode across the first and second terminals of the inductive load, and the control circuit comprises a timer circuit having an output coupled to a control terminal of the third switch, the timer circuit activating the third switch for a period of time.

17. The drive circuit of claim 16, wherein the timer circuit comprises counter circuitry and a latch circuit having an input coupled to an output of the counter circuitry, and an output connected to the control terminal of the third switch.

18. The drive circuit of claim 16, wherein the control circuit comprises microprocessor or microcontroller, and wherein the timer circuitry is part of the microprocessor or microcontroller.

19. The drive circuit of claim 14, wherein the control circuit controls one of the high-side switch and the low-side switch with a pulsewidth modulated signal and the other of the high-side switch and the low-side switch with an enable control signal.

\* \* \* \* \*